(12) United States Patent
Zhou et al.

(10) Patent No.: US 11,996,807 B2
(45) Date of Patent: May 28, 2024

(54) LOW NOISE TRANS-IMPEDANCE AMPLIFIER

(71) Applicant: Beken Corporation, Pudong New District (CN)

(72) Inventors: Haiyan Zhou, Pudong New District (CN); Ronghui Kong, Pudong New District (CN); Jiazhou Liu, Pudong (CN)

(73) Assignee: Beken Corporation, Shanghai (CN)

( * ) Notice: Subject to any disclaimer, the term of this patent is extended or adjusted under 35 U.S.C. 154(b) by 155 days.

(21) Appl. No.: 17/662,194

(22) Filed: May 5, 2022

(65) Prior Publication Data

US 2023/0318535 A1    Oct. 5, 2023

(30) Foreign Application Priority Data

Apr. 4, 2022   (CN) .......................... 202210352454.X

(51) Int. Cl.
| | | |
|---|---|---|
| *H03F 1/08* | (2006.01) | |
| *H03F 1/26* | (2006.01) | |
| *H03F 3/45* | (2006.01) | |
| *H04B 10/60* | (2013.01) | |

(52) U.S. Cl.
CPC .............. *H03F 1/083* (2013.01); *H03F 1/26* (2013.01); *H03F 3/45* (2013.01); *H04B 10/60* (2013.01)

(58) Field of Classification Search
CPC ... H03F 1/083; H03F 1/26; H03F 3/45; H03F 3/16; H03F 2200/294; H03F 3/4521; H03F 3/45183; H04B 10/60

USPC .......................................... 330/252–261, 308
See application file for complete search history.

(56) References Cited

U.S. PATENT DOCUMENTS

| | | | |
|---|---|---|---|
| 4,462,002 A | 7/1984 | Schade, Jr. | |
| 4,988,954 A | 1/1991 | Stern et al. | |
| 7,227,420 B2* | 6/2007 | Schimper | H03F 3/45179 |
| | | | 330/253 |
| 9,979,350 B2* | 5/2018 | Yu | H03F 3/45179 |
| 2008/0036537 A1 | 2/2008 | Syed | |
| 2008/0079494 A1 | 4/2008 | Aram | |
| 2012/0262235 A1 | 10/2012 | Hoogzaad | |
| 2021/0184639 A1 | 6/2021 | Bronzi | |

OTHER PUBLICATIONS

"U.S. Appl. No. 17/662,200, Notice of Allowance dated May 1, 2023", 7 pgs.

* cited by examiner

*Primary Examiner* — Hieu P Nguyen
(74) *Attorney, Agent, or Firm* — Schwegman Lundberg & Woessner, P.A.

(57) ABSTRACT

A new trans-impedance amplifier (TIA) with low noise is provided. The TIA may include an input stage and an output driving stage. The input stage may include a pair of input PMOS transistors, a pair of input NMOS transistors, and a pair of differential voltage input nodes. The output driving stage may include a pair of output circuits, each may include a first pair of PMOS and NMOS transistors electrically connected in parallel, a second pair of PMOS and NMOS transistors electrically connected in series, and a pair of capacitors electrically connected in series, which are electrically connected in parallel. The structure can lead to a reduced noise level of the TIA.

20 Claims, 4 Drawing Sheets

LOW NOISE TRANS-IMPEDANCE AMPLIFIER

CROSS REFERENCE TO RELATED APPLICATIONS

This application claims priority to and incorporates by reference Chinese Patent Application No. 202210352454.X filed 4 Apr. 2022.

TECHNICAL FIELD

The present application relates to a trans-impedance amplifier (TIA), particularly to a low noise TIA.

BACKGROUND

TIAs are widely used in electronic devices such as photoelectric receivers and op-amps. Typically, a receiver front end (RXFE) of a photoelectric receiver may include a low noise amplifier (LNA), a mixer, and a TIA, for example, and noise incurred by the TIA may greatly affect the performance of the receiver. Therefore, a new TIA with reduced noise becomes highly desirable.

SUMMARY

According to an embodiment, a TIA may comprise an input stage and an output driving stage. The input stage may comprise a first and a second input PMOS transistors; a first and a second load NMOS transistors, wherein drains of the first and the second input PMOS transistors and drains of the first and the second load NMOS transistors are electrically connected; and a first and a second differential voltage input nodes respectively electrically connected to gates of the first and the second input PMOS transistors. The output driving stage may comprise a first and a second output circuits, each of the first and the second output circuits comprising: a first pair of PMOS and NMOS transistors electrically connected in parallel; a second pair of PMOS and NMOS transistors electrically connected in series; a pair of capacitors electrically connected in series; and a differential output node electrically connected to a drain of a NMOS transistor of the second pair of PMOS and NMOS transistors.

According to an embodiment, a TIA may comprise an input stage and an output driving stage. The input stage may comprise a first and a second input PMOS transistors, a first and a second load NMOS transistors, and a first and a second differential voltage input nodes. The output driving stage may comprise a first and a second output circuits each comprising: a first pair of PMOS and NMOS transistors electrically connected in parallel; a second pair of PMOS and NMOS transistors electrically connected in series; a pair of capacitors electrically connected in series; a differential output node electrically connected to a drain of a NMOS transistor of the second pair of PMOS and NMOS transistors; and a third PMOS transistor electrically connecting a gate of the NMOS transistor of the second pair of PMOS and NMOS transistors to a drain of the first or the second input PMOS transistors of the input stage.

According to an embodiment, a receiver front end (RXFE) may comprise a low noise amplifier (LNA), a mixer, and a TIA that are electrically connected in series. The TIA may comprise an input stage and an output driving stage. The input stage may comprise a first and a second input PMOS transistors, a first and a second load NMOS transistors, and a first and a second differential voltage input nodes. The output driving stage may comprise a first and a second output circuits each comprising: a first pair of PMOS and NMOS transistors electrically connected in parallel; a second pair of PMOS and NMOS transistors electrically connected in series; a pair of capacitors electrically connected in series; a differential output node electrically connected to a drain of a NMOS transistor of the second pair of PMOS and NMOS transistors; and a third PMOS transistor electrically connecting a gate of the NMOS transistor of the second pair of PMOS and NMOS transistors to a drain of the first or the second input PMOS transistors of the input stage.

According to an embodiment, a method of amplifying a voltage signal may comprise receiving differential input voltages with a first and a second differential voltage input nodes of a trans-impedance amplifier (TIA), wherein the TIA may include an input stage comprising a first and a second input PMOS transistors; a first and a second load NMOS transistors, wherein drains of the first and the second input PMOS transistors and drains of the first and the second load NMOS transistors are electrically connected; and a first and a second differential voltage input nodes respectively electrically connected to gates of the first and the second input PMOS transistors; and an output driving stage comprising a first and a second output circuits each comprising a first pair of PMOS and NMOS transistors electrically connected in parallel; a second pair of PMOS and NMOS transistors electrically connected in series; a pair of capacitors electrically connected in series; and a differential output node electrically connected to a drain of a NMOS transistor of the second pair of PMOS and NMOS transistors. The method may also comprise amplifying the differential input voltages by the input stage and the output driving stage to create amplified differential output voltages; and outputting the amplified differential output voltages to the first and the second differential output nodes.

BRIEF DESCRIPTION OF THE DRAWINGS

Non-limiting and non-exhaustive embodiments of the present application are described with reference to the following figures, wherein like reference numerals refer to like parts throughout the various views unless otherwise specified.

DETAILED DESCRIPTION

Various aspects and examples of the application will now be described. The following description provides specific details for a thorough understanding and enabling description of these examples. Those skilled in the art will understand, however, that the application may be practiced without many of these details.

Additionally, some well-known structures or functions may not be shown or described in detail, to avoid unnecessarily obscuring the relevant description.

The terminology used in the description presented below is intended to be interpreted in its broadest reasonable manner, even though it is being used in conjunction with a detailed description of certain specific examples of the application. Certain terms may even be emphasized below, however, any terminology intended to be interpreted in any restricted manner will be overtly and specifically defined as such in this Detailed Description section. Hereinafter, "PM" or "MP" may represent PMOS transistors, and "NM" or "MN" may represent NMOS transistors.

Without loss of generality, reference will be made to illustrative embodiments by taking a TIA and a RXFE including the TIA as example. Those of ordinary skills in the art understand that this is only to describe the application clearly and adequately, rather than limit the scope of the application, which is defined by the appended claims.

Figure 1:
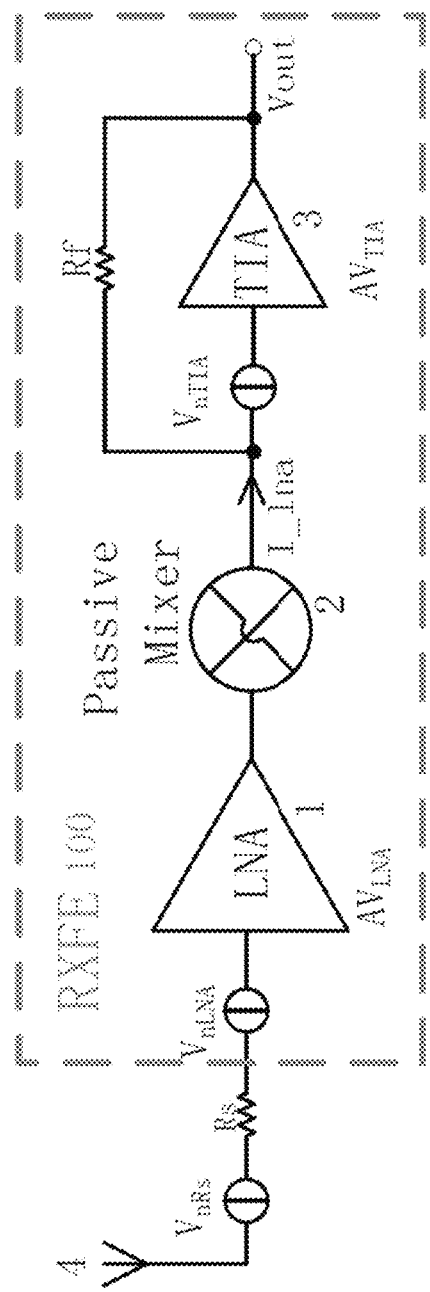
FIG. 1 is a drawing illustrating a RXFE including a TIA according to an embodiment.

FIG. 1 is a drawing illustrating a RXFE 100 of a receiver according to an embodiment of the application. As shown in FIG. 1, the RXFE 100 of the receiver (e.g., a photoelectric receiver not shown) includes an LNA 1, a mixer 2 (e.g., a passive mixer), and a TIA 3, which are all connected in series. The RXFE 100 also includes a feedback resistor Rf that is electrically connected to the TIA 3 in parallel. In some embodiments, an antenna 4 is electrically connected to the LNA 1 of the RXFE 100. Rs represents a parasitic equivalent resistor on a connection line.

The LNA 1 normally works at a high frequency (HF), while the TIA 3 normally works at a medium frequency (MF) or a low frequency (LF). For example, the LNA 1 works at a higher frequency than the TIA 3. For example, the LNA 1 receives a HF voltage signal $V_{nLNA}$ and outputs to the mixer 2 a HF current signal, which is thus transformed by the mixer 2 into a MF or LF current signal $I_{LNA}$ that is output to the TIA 3. After that, the TIA 3 transforms the current signal $I_{LNA}$ into a MF or LF voltage signal $V_{out}$ (e.g., $V_{out}=I_{LNA}*R_f$) and outputs the voltage signal $V_{out}$ to a following circuit (a filter, for example) to make further operations.

The total noise level of RXFE 100 of the receiver is mainly determined by both the LNA 1 and the TIA 3, e.g., in a situation that the mixer 2 is passive. Thus, the total noise level of RXFE 100 can be greatly suppressed by reducing the noise incurred by the TIA 3.

Referring to Equation (1) as shown below, $F_{total}$ represents a total noise factor of the RXFE 100, $V_{nLNA}$ represents an input voltage of the LNA 1, $V_{nTIA}$ represents an input voltage of the TIA 3, $AV_{LNA}$ represents an open loop gain of the LNA 1, and Rs represents the parasitic equivalent resistor on the connection line. Rs may cause a heat noise, which may greatly affect the noise level of the RXFE 100 and can be simulated by an equivalent noise voltage $V_{nRs}$. For example, $V_{nRs}=4kTR_s$, here k is a Boltzmann constant, and T is a Kelvins temperature.

$$F_{total} = \frac{V_{nLNA}^2 + V_{nTIA}^2/AV_{LNA}^2 + 4kTR_S}{4kTR_S} \quad (1)$$

Figure 2:
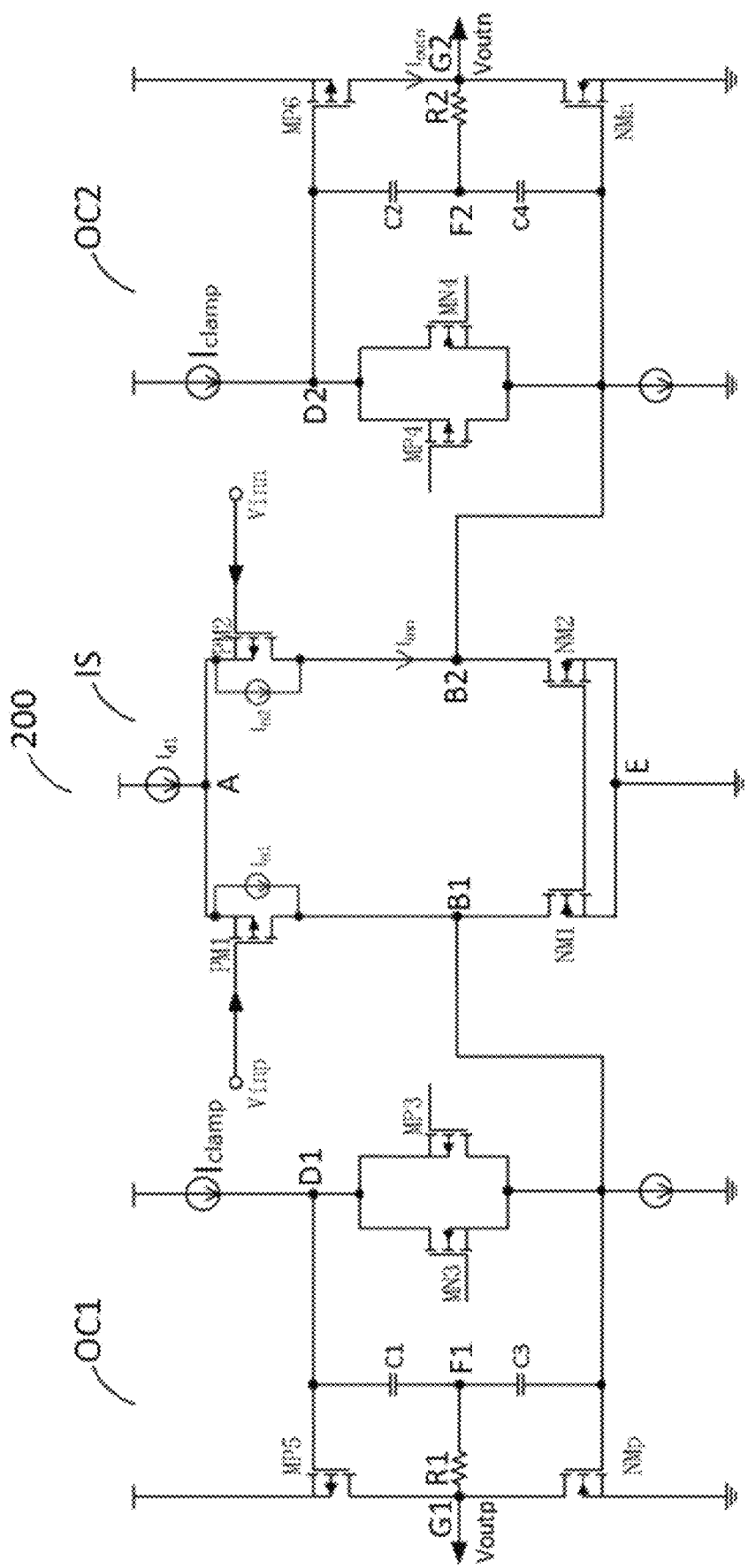
FIG. 2 is a circuit diagram illustrating a TIA according to an embodiment.

FIG. 2 is a circuit diagram illustrating a TIA 200 according to an embodiment of the application. For example, the TIA 200 may include a first stage (e.g., an input stage, "IS") and a second stage (e.g., an output driving stage, "ODS").

As shown in FIG. 2, the first stage (IS) of the TIA 200 includes a pair of differential input PMOS transistors PM1 and PM2, a pair of load NMOS transistors NM1 and NM2, and a pair of differential voltage input nodes $V_{inp}$ and $V_{inn}$ that are respectively electrically connected to gates of the pair of PM1 and PM2 to respectively receive differential input voltages from outside (e.g., from another circuit).

In some embodiments, sources of the pair of PM1 and PM2 of the first stage are electrically connected to a common point A, and can receive a DC bias current $I_{d1}$ that may ensure the first stage to work at a suitable current working condition. In some embodiments, sources of the pair of NM1 and NM2 of the first stage are electrically connected to a common point E, which can be grounded.

In some embodiments, drains of PM1 and NM1 are electrically connected to a point B1, while drains of PM2 and NM2 are electrically connected to a point B2, and thus the pair of PM1 and PM2 and the pair of NM1 and NM2 in the first stage can determine the total gain of the first stage of the TIA 200.

As shown in FIG. 2, the first stage (IS) includes a first branch including PM1 and NM1 electrically connected in series, and a second branch including PM2 and NM2 electrically connected in series. The first branch and the second branch are electrically connected in parallel.

As shown in FIG. 2, the second stage (ODS) of the TIA 200 includes a pair of a first output circuit OC1 and a second output circuit OC2 respectively including a pair of differential output nodes $V_{outp}$ and $V_{outc}$ to output the amplified differential voltages to another circuit. In some embodiments, both of the OC1 and the OC2 of the second stage may receive a DC bias current $I_{clamp}$ that may ensure the second stage to work at a suitable current working condition.

In some embodiments, the OC1 may include a pair of MP3 and MN3, a pair of capacitors C1 and C3, and a pair of MP5 and NMp, which are electrically connected in parallel.

In the pair of MP3 and MN3, MP3 and MN3 are electrically connected in parallel. The drain of MN3 and the source of MP3 are electrically connected to a common point D1, and can receive the DC bias $I_{clamp}$. The source of MN3 and the drain of MP3 are electrically connected to the common point B1.

In the pair of capacitors C1 and C3, C1 and C3 are electrically connected in series between the common points D1 and B1.

In the pair of MP5 and NMp, the gate of MP5 is electrically connected to the common point D1, drains of MP5 and NMp are electrically connected to a common point G1, and the gate of NMp is electrically connected to the common point B1.

The OC1 also may include a resistor R1 electrically connected between the common point G1 and a common point F1, the F1 being electrically connected between the capacitors C1 and C3. R1, C1 and C3 can provide a miller compensation to the positive output node $V_{outp}$ of the OC1.

The OC2 may have a structure similar to that of OC1. In some embodiments, the OC2 may include a pair of MP4 and MN4, a pair of capacitors C2 and C4, and a pair of MP6 and NMn, which are electrically connected in parallel.

In the pair of MP4 and MN4, MP4 and MN4 are electrically connected in parallel. The drain of MN4 and the source of MP4 are electrically connected to a common point D2, and can receive the DC bias $I_{clamp}$. The source of MN4 and the drain of MP4 are electrically connected to the common point B2.

In the pair of capacitors C2 and C4, C2 and C4 are electrically connected in series between the common points D2 and B2.

In the pair of MP6 and NMn, the gate of MP6 is electrically connected to the common point D2, drains of MP6 and NMn are electrically connected to a common point G2, and the gate of NMn is electrically connected to the common point B2.

The OC2 also may include a resistor R2 electrically connected between the common point G2 and a common point F2, the F2 being electrically connected between C2 and C4. R2, C2 and C4 can provide a miller compensation to the negative output node $V_{outn}$ of the OC1.

The OC1 and OC2 of the second stage may further amplify the signals (e.g., differential voltage signals) that have been amplified by the first stage, and output the further amplified signals to the differential output nodes $V_{outp}$ and $V_{outn}$.

In FIG. 2, $I_{d1}$ represents a DC bias current supplied to the first stage, and $I_{n1}$ and $I_{n2}$ respectively represent thermal noise currents passing through the PM1 and the PM2:

$$I_{n1}^2 = 4kT\gamma g_{mp1}$$

$$I_{n2}^2 = 4kT\gamma g_{mp2}$$

Referring to Equation (2), DC bias currents passing through the PM1 and the PM2 are the same, i.e., $g_{mp1} = g_{mp2} = g_{mp}$, thus $I_{n1}^2 = I_{n2}^2 = 4kT\gamma g_{mp}$. Accordingly, the noise voltage equivalent to the input end is:

$$V_n^2 = \frac{4kT\gamma}{g_{mp}} \tag{2}$$

Figure 3:
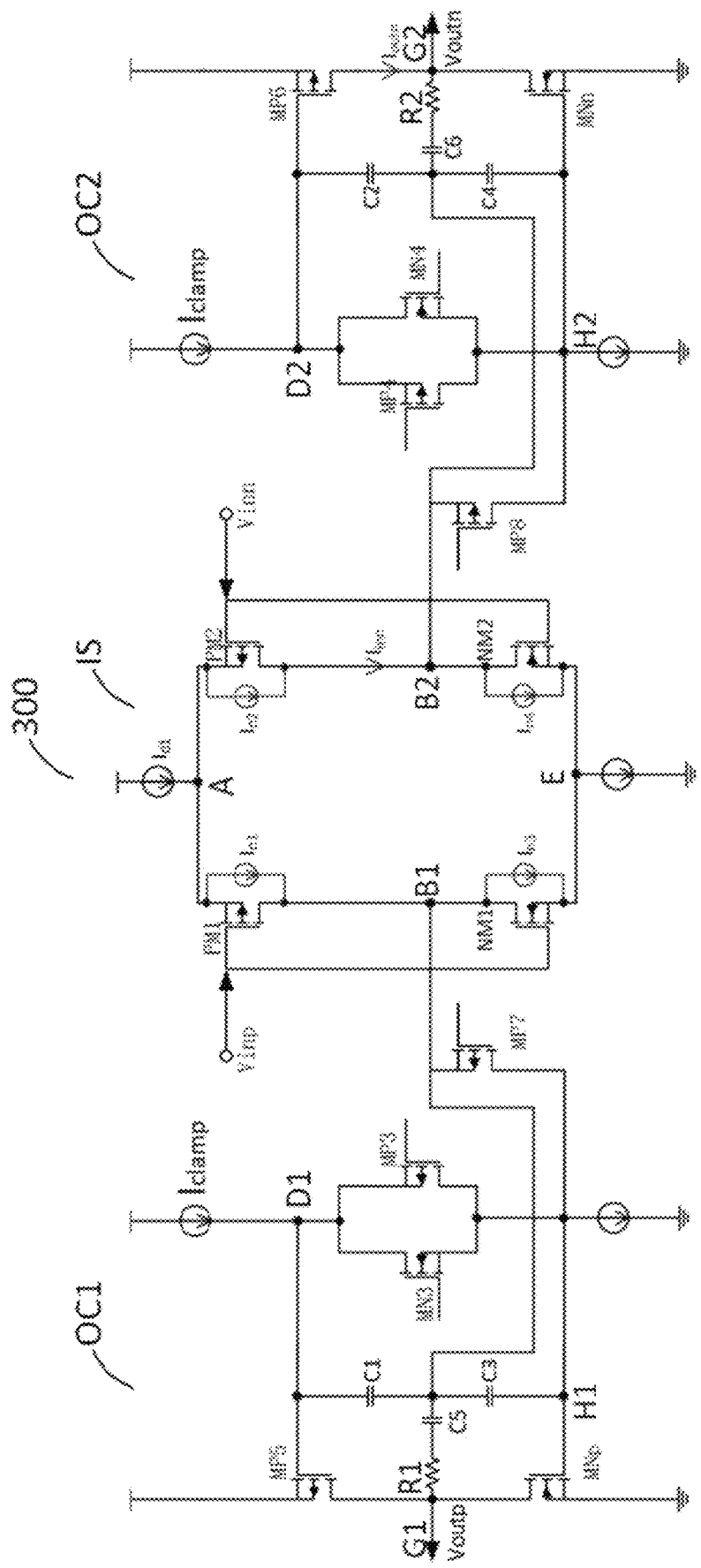
FIG. 3 is a circuit diagram illustrating a TIA according to another embodiment.

FIG. 3 is a circuit diagram illustrating a TIA 300 according to another embodiment. The TIA 300 includes a first stage (e.g., an input stage, "IS") and a second stage (e.g., an output driving stage, "ODS"). The first stage of the TIA 300 includes a pair of differential input PMOS transistors PM1 and PM2, a pair of differential input NMOS transistors NM1 and NM2, and a pair of differential voltage input nodes $V_{inp}$ and $V_{inn}$ to receive differential input voltages (e.g., from another circuit).

In some embodiments, the $V_{inp}$ node is electrically connected to gates of both the PM1 and NM1, and thus can supply an input voltage $V_{inp}$ to the gates of both the PM1 and NM1. The $V_{inn}$ node is electrically connected to gates of both the PM2 and NM2, and thus can supply an input voltage $V_{inn}$ to the gates of both the PM2 and NM2.

In some embodiments, sources of the pair of PM1 and PM2 of the first stage (IS) are electrically connected to a common point A, and may receive a DC bias current $I_{d1}$ to ensure the first stage to work at a suitable current working condition. In some embodiments, sources of the pair of NM1 and NM2 of the first stage are electrically connected to a common point E, which can be grounded.

In some embodiments, drains of PM1 and NM1 are electrically connected to a point B1, and drains of the PM2 and the NM2 are electrically connected to a common point B2. Thus, the pair of PM1 and PM2 as well as the pair of NM1 and NM2 of the first stage can determine the total gain of the first stage of the TIA 300.

As shown in FIG. 3, the second stage (ODS) of the TIA 300 includes a pair of a first output circuit OC1 and a second output circuit OC2 respectively including differential output nodes $V_{outp}$ and $V_{outn}$ to output the amplified differential voltages to another circuit. Both of the OC1 and the OC2 of the second stage may receive a DC bias current $I_{clamp}$ that may ensure the second stage to work at a suitable current working condition.

The OC1 may include a pair of MP3 and MN3. The drain of MN3 and the source of MP3 are electrically connected to a common point D1, and can receive the DC bias $I_{clamp}$. The source of MN3 and the drain of MP3 are electrically connected to a common point H1.

The OC1 also may include a pair of capacitors C1 and C3 that are electrically connected in series between the common points D1 and H1.

The OC1 also may include a pair of MP5 and MNp. The gate of PM5 is electrically connected to the common point D1, drains of MP5 and MNp are electrically connected to a common point G1, and the gate of MNp is electrically connected to the common point H1.

The OC1 also may include a resistor R1 and a capacitor C5 electrically connected in series between the common points G1 and B1, the B1 being electrically connected between the capacitors C1 and C3. R1, C1, C3 and C5 can provide a miller compensation to the positive output node $V_{outp}$ of the OC1.

The OC1 also may include a MP7 electrically connected between the common points H1 and B1. The source of MP7 is electrically connected to the common point B1, and the drain of MP7 is electrically connected to the common point H1.

The OC1 and OC2 have similar structures. In some embodiments, the OC2 may include a pair of MP4 and MN4. The drain of MN4 and the source of MP4 are electrically connected to a common point D2, and can receive the DC bias $I_{clamp}$. The source of MN4 and the drain of MP4 are electrically connected to a common point H2.

The OC2 also may include a pair of capacitors C2 and C4 that are electrically connected in series between the common points D2 and H2.

The OC2 also may include a pair of MP6 and MNn. The gate of MP6 is electrically connected to the common point D2, drains of MP6 and MNn are electrically connected to a common point G2, and the gate of MNn is electrically connected to the common point H2.

The OC2 also may include a resistor R2 and a capacitor C6 electrically connected in series between the common points G2 and B2, the B2 being electrically connected between the capacitors C2 and C4. R2, C2, C4 and C6 can provide a miller compensation to the negative output node $V_{outn}$ of the OC1.

The OC2 also may include a MP8 electrically connected between the common points H2 and B2. The source of MP8 is electrically connected to the common point B2, and the drain of MP8 is electrically connected to the common point H1.

As shown in FIG. 3, both of the pair of OC1 and OC2 of the second stage may receive a DC bias current $I_{clamp}$ to ensure the second stage to work at a suitable current working condition. The OC1 and the OC2 of the second stage may further amplify the signals (e.g., differential voltage signals) that already have been amplified by the first stage, and may output the further amplified signals to the pair of differential output nodes $V_{outp}$ and $V_{outn}$ in order to output to a following circuit (such as a filter).

In FIG. 3, $I_{d1}$ represents a bias current supplied to the first stage, and $I_{n1}$, $I_{n2}$, $I_{n3}$, and $I_{n4}$ respectively represent thermal noise currents passing through the input transistors PM1, PM2, NM3, and NM4:

$$I_{n1}^2 = 4kT\gamma g_{mp1}$$

$$I_{n2}^2 = 4kT\gamma g_{mp2}$$

$$I_{n3}^2 = 4kT\gamma g_{mn3}$$

$$I_{n4}^2 = 4kT\gamma g_{mn4}$$

Referring to Equation (3), DC bias currents on the input transistors PM1, PM2, NM3, and NM4 are the same, i.e., $g_{mp1}=g_{mp2}=g_{mp}$, $g_{mn3}=g_{mn4}=g_{mn}$, $I_{n1}^2=I_{n2}^2=4kT\gamma g_{mp}$, $I_{n3}^2=I_{n4}^2=4kT\gamma g_{mn}$, thus, the noise voltage equivalent to the input end is:

$$V_n^2 = \frac{(4kT\gamma g_{mp} + 4kT\gamma g_{mn})}{(g_{mn} + g_{mp})^2} = \frac{4kT\gamma}{g_{mn} + g_{mp}} \quad (3)$$

Comparing Equation (2) and Equation (3), the structure of the TIA 300 with the additional pair of input NMOS transistors NM3 and NM4 can reduce the equivalent input thermal noise voltage under the same DC bias current. Therefore, the TIA 300 may incur a reduced noise voltage to the RXFE, and thus may reduce the total noise level of the RXFE.

Figure 4:
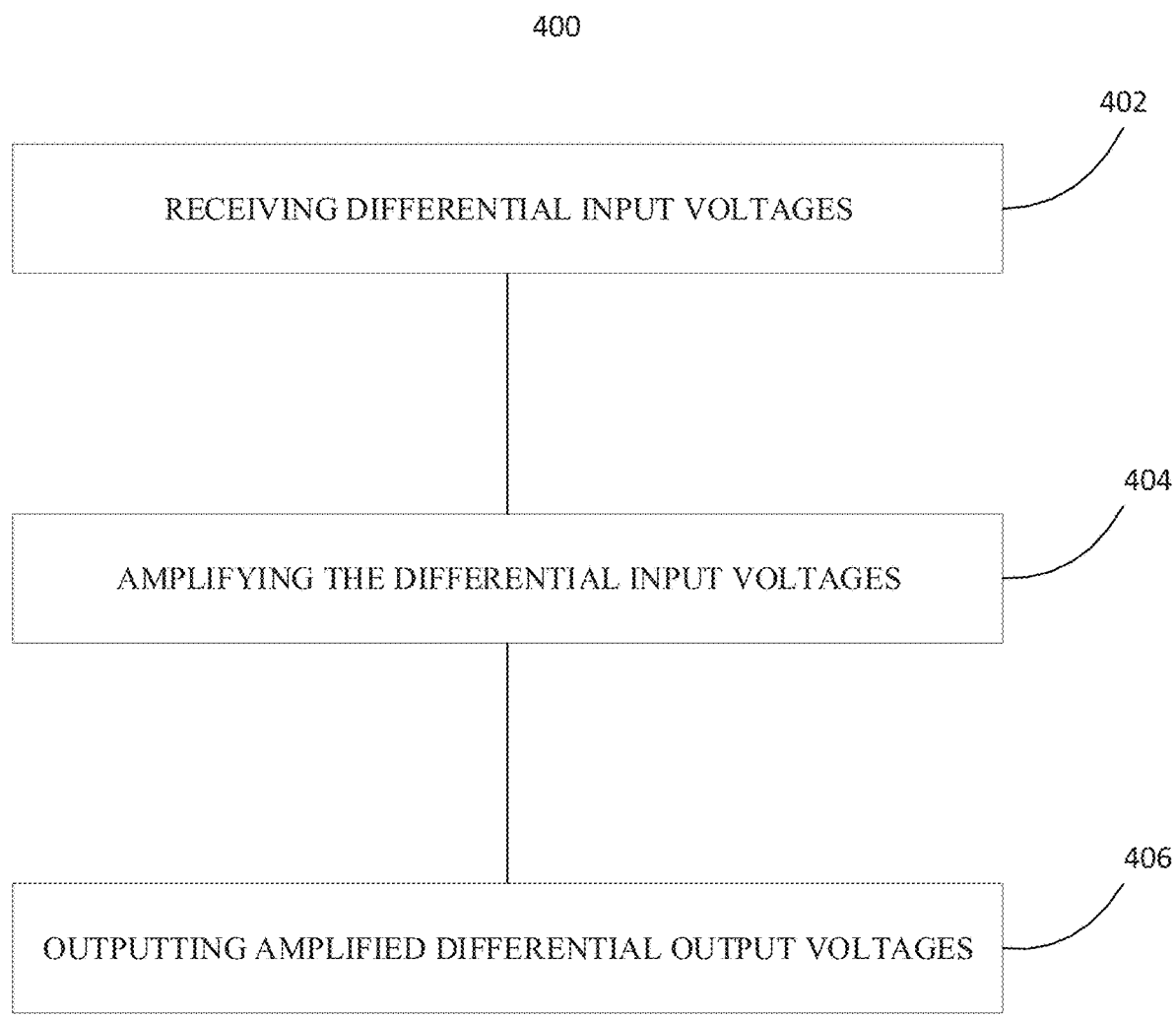
FIG. 4 is a flowchart illustrating a method of low noise amplification.

FIG. 4 is a flowchart illustrating a method 400 of low noise amplification by using a TIA (e.g., TIA 200 as shown in FIG. 2, or TIA 300 as shown in FIG. 3) including a first stage (e.g., an input stage) and a second stage (e.g., an output driving stage). In an embodiment, in block 402, receiving differential input voltages (e.g., from outside) as an input signal by a pair of differential voltage input nodes $V_{inp}$ and $V_{inn}$ in the first stage of the TIA, in block 404, amplifying the differential input voltages by both the first stage and the second stage of the TIA to create amplified differential output voltages, and in block 406, outputting the amplified differential output voltages to a pair of differential output nodes $V_{outp}$ and $V_{outn}$ in the second stage of the TIA to obtain an amplified signal with reduced noise level as discussed above.

Features and aspects of various embodiments may be integrated into other embodiments, and embodiments illustrated in this document may be implemented without all of the features or aspects illustrated or described.

One skilled in the art will appreciate that although specific examples and embodiments of the system and methods have been described for purposes of illustration, various modifications can be made without deviating from the spirit and scope of the present application. Moreover, features of one embodiment may be incorporated into other embodiments, even where those features are not described together in a single embodiment within the present document. Accordingly, the application is described by the appended claims.

What is claimed is:

1. A trans-impedance amplifier (TIA) (200) comprising:
an input stage (IS) comprising:
a first and a second input PMOS transistors (PM1, PM2);
a first and a second load NMOS transistors (NM1, NM2), wherein drains of the first and the second input PMOS transistors and drains of the first and the second load NMOS transistors are electrically connected; and
a first and a second differential voltage input nodes ($V_{inp}$, $V_{inn}$) respectively electrically connected to gates of the first and the second input PMOS transistors; and
an output driving stage (ODS) comprising a first and a second output circuits (OC1, OC2), each of the first and the second output circuits comprising:
a first pair of PMOS and NMOS transistors (MP3, MN3) electrically connected in parallel;
a second pair of PMOS and NMOS transistors (MP5, MNp) electrically connected in series;
a pair of capacitors (C1, C3) electrically connected in series; and a differential output node ($V_{outp}$) electrically connected to a drain of a NMOS transistor (NMp) of the second pair of PMOS and NMOS transistors.

2. The TIA of claim 1, wherein the first pair of PMOS and NMOS transistors, the second pair of PMOS and NMOS transistors, and the pair of capacitors are electrically connected in parallel in the output driving stage.

3. The TIA of claim 2, wherein a gate of the NMOS transistor (NMp) of the second pair of PMOS and NMOS transistors of the output driving stage is electrically connected to a drain of the first or the second input PMOS transistors (PM1, PM2) of the input stage.

4. The TIA of claim 2, wherein a drain of the PMOS transistor (MP3) and a source of the NMOS transistor (MN3) of the first pair of PMOS and NMOS transistors of the output driving stage are electrically connected in common to a drain of the first or the second input PMOS transistor (PM1, PM2) of the input stage.

5. The TIA of claim 2, wherein a source of the PMOS transistor (PM3) and a drain of the NMOS transistor (NM3) of the first pair of PMOS and NMOS transistors are electrically connected in common to a gate of a NMOS transistor (PM5) of the second pair of PMOS and NMOS transistors of in the output driving stage.

6. The TIA of claim 2, wherein each of the first and the second output circuits comprises a resistor (R1) electrically connected between a first and a second common points (F1, G1), the first common point being electrically connected between the pair of capacitors (C1, C3), and the second common point being electrically connected between the second pair of PMOS and NMOS transistors (MP5, NMp).

7. The TIA of claim 1, wherein an input DC bias current is provided to the first and the second input PMOS transistors of the input stage.

8. The TIA of claim 1, wherein an output DC bias current is provided to the first pair of PMOS and NMOS transistors (MP3, MN3) of each of the first and the second output circuits of the output driving stage.

9. The TIA of claim 1, wherein a source of the NMOS transistor (NMp) of the second pair of PMOS and NMOS transistors of the output driving stage is grounded.

10. A trans-impedance amplifier (TIA) (300) comprising:
an input stage comprising a first and a second input PMOS transistors (PM1, PM2), a first and a second load NMOS transistors (NM1, NM2), and a first and a second differential voltage input nodes ($V_{inp}$, $V_{inn}$); and
an output driving stage comprising a first and a second output circuits (OC1, OC2) each comprising:
a first pair of PMOS and NMOS transistors (MP3, MN3) electrically connected in parallel;
a second pair of PMOS and NMOS transistors (MP5, MNp) electrically connected in series;
a pair of capacitors (C1, C3) electrically connected in series;
a differential output node ($V_{outp}$) electrically connected to a drain of a NMOS transistor (MNp) of the second pair of PMOS and NMOS transistors; and
a third PMOS transistor (MP7) electrically connecting a gate of the NMOS transistor of the second pair of PMOS and NMOS transistors to a drain of the first or the second input PMOS transistors (PM1, PM2) of the input stage.

11. The TIA of claim 10, wherein the first pair of PMOS and NMOS transistors, the second pair of PMOS and NMOS transistors, and the pair of capacitors are electrically connected in parallel in the output driving stage.

12. The TIA of claim 10, wherein a source of the third PMOS transistor (PM7) is electrically connected a drain of the first or the second input PMOS transistor (PM1) in the output driving stage, and wherein a drain of the third PMOS transistor (MP7) is electrically connected the gate of the NMOS transistor (MNp) of the second pair of PMOS and NMOS transistors in the output driving stage.

13. The TIA of claim 10, wherein each of the first and the second output circuits of the output driving stage comprises a resistor (R1) and a third capacitor (C5) electrically connected in series and between a first and a second common points (B1, G1), the first common point (B1) being electrically connected between the pair of capacitors (C1, C3) of the output driving stage and electrically connected to a drain of the first or the second input PMOS transistor (PM1) of the input stage, and the second common point (G1) being electrically connected to the differential output node ($V_{outp}$).

14. The TIA of claim 10, wherein gates of the first input PMOS transistor (PM1) and the first load NMOS transistor (NM1) are electrically connected in common to the first differential voltage input node (Vinp) in the input stage, and wherein gates of the second input PMOS transistor (PM2) and the second load NMOS transistor (NM2) are electrically connected in common to the second differential voltage input node (Vinn) in the input stage.

15. The TIA of claim 10, wherein an input DC bias current is provided to the first and the second input PMOS transistors of the input stage.

16. The TIA of claim 15, wherein the input DC bias current is provided to sources of the first and the second input PMOS transistors of the input stage.

17. The TIA of claim 10, wherein an output DC bias current is provided to the first pair of PMOS and NMOS transistors (MP3, MN3) of each of the first and the second output circuits in the output driving stage.

18. The TIA of claim 17, wherein the output DC bias current is provided to a source of the PMOS transistor (MP3) and a drain of the NMOS transistor (MN3) of the first pair of PMOS and NMOS transistors that are electrically connected in common.

19. The TIA of claim 10, wherein a drain of the PMOS transistor (MP3) and a source of the NMOS transistor (MN3) of the first pair of PMOS and NMOS transistors of the output driving stage are electrically connected in common to a gate of the NOMS transistor (MNp) of the second pair of PMOS and NMOS transistors in the output driving stage.

20. A method (400) of amplifying a voltage signal comprising:
receiving differential input voltages with a first and a second differential voltage input nodes of a transimpedance amplifier (TIA), the TIA including an input stage comprising a first and a second input PMOS transistors;
a first and a second load NMOS transistors, wherein drains of the first and the second input PMOS transistors and drains of the first and the second load NMOS transistors are electrically connected; and a first and a second differential voltage input nodes respectively electrically connected to gates of the first and the second input PMOS transistors; and
an output driving stage comprising a first and a second output circuits each comprising a first pair of PMOS and NMOS transistors electrically connected in parallel; a second pair of PMOS and NMOS transistors electrically connected in series; a pair of capacitors electrically connected in series; and a differential output node electrically connected to a drain of a NMOS transistor of the second pair of PMOS and NMOS transistors;
amplifying the differential input voltages by the input stage and the output driving stage to create amplified differential output voltages; and
outputting the amplified differential output voltages to the first and the second differential output nodes.

* * * * *